(12) United States Patent
Hobson et al.

(10) Patent No.: US 8,302,948 B2
(45) Date of Patent: Nov. 6, 2012

(54) TEST FIXTURE WITH HIGH-CURRENT ELECTRICAL CONNECTION

(75) Inventors: Michael A. Hobson, Tucson, AZ (US); David A. Milani, Tucson, AZ (US)

(73) Assignee: Raytheon Company, Waltham, MA (US)

(*) Notice: Subject to any disclaimer, the term of this patent is extended or adjusted under 35 U.S.C. 154(b) by 924 days.

(21) Appl. No.: 12/275,708

(22) Filed: Nov. 21, 2008

(65) Prior Publication Data

US 2010/0130073 A1　May 27, 2010

(51) Int. Cl.
*B25B 1/20* (2006.01)
*B25B 5/00* (2006.01)
*B25B 1/10* (2006.01)
*B25B 5/10* (2006.01)
*B23Q 3/08* (2006.01)
*G01R 31/00* (2006.01)
*A61B 18/18* (2006.01)
*H01R 4/28* (2006.01)

(52) U.S. Cl. ....... 269/43; 269/246; 269/32; 324/750.03; 606/51

(58) Field of Classification Search .................... 269/43, 269/246, 32, 139, 240; 324/750.03, 750.19, 324/750.29; 606/51.33
See application file for complete search history.

(56) References Cited

U.S. PATENT DOCUMENTS

| | | | | |
|---|---|---|---|---|
| 2,190,510 A | * | 2/1940 | Best | 439/819 |
| 2,880,638 A | * | 4/1959 | Muggli et al. | 269/139 |
| 3,359,899 A | * | 12/1967 | Luehrs | 101/415.1 |
| 3,397,880 A | * | 8/1968 | Kuban | 269/240 |
| 3,548,918 A | * | 12/1970 | Cerwenka et al. | 164/515 |
| 3,845,962 A | * | 11/1974 | Molin | 279/4.04 |
| 3,908,522 A | * | 9/1975 | Bender | 493/194 |
| 4,131,257 A | * | 12/1978 | Sterling | 248/67.5 |
| 4,199,180 A | * | 4/1980 | Kelly | 294/33 |
| 4,300,780 A | * | 11/1981 | Urbanic | 279/4.12 |
| 4,506,567 A | * | 3/1985 | Makhlouf | 81/57.3 |
| 4,646,639 A | * | 3/1987 | Gollinger et al. | 101/415.1 |
| 4,704,512 A | * | 11/1987 | Lisec | 219/101 |
| 4,848,870 A | * | 7/1989 | Wisecarver et al. | 385/55 |
| 5,102,212 A | * | 4/1992 | Patterson | 385/98 |
| 5,189,717 A | * | 2/1993 | Larson et al. | 385/95 |
| 5,506,512 A | * | 4/1996 | Tozawa et al. | 324/750.19 |

(Continued)

OTHER PUBLICATIONS

International Search Report and Written Opinion from corresponding International Application No. PCT/US09/54743.

*Primary Examiner* — Lee D Wilson
*Assistant Examiner* — Alvin Grant
(74) *Attorney, Agent, or Firm* — Renner, Otto, Boisselle & Sklar, LLP

(57) ABSTRACT

A test fixture for making an electrical connection with electrical contacts of a circuit board includes jaws made of conductive material. The jaws may be monolithic pieces of copper, with a pair of sections that pivot along a thin hinged portion at one end. The jaws float freely within a test fixture housing, allowing the jaws to reposition themselves within the housing to adjust to variations in position of the electrical contacts. A clamping mechanism pushes free ends of the jaw sections toward one another, causing engagement between the sections and the electrical contacts. The test fixture provides a way to provide good contact area and good contact pressure, allowing large-current flows between the jaws and the electrical contacts, while at the same time providing substantially no force on the circuit board in a direction perpendicular to the circuit board.

22 Claims, 7 Drawing Sheets

U.S. PATENT DOCUMENTS

| | | | | |
|---|---|---|---|---|
| 5,894,405 A * | 4/1999 | Fleege et al. | | 361/634 |
| 6,062,553 A * | 5/2000 | Strehl | | 269/43 |
| 6,078,187 A * | 6/2000 | Hanners et al. | | 324/756.03 |
| 6,149,146 A * | 11/2000 | Pleban | | 269/246 |
| 6,206,354 B1 * | 3/2001 | Lin | | 269/43 |
| 6,377,062 B1 * | 4/2002 | Ramos et al. | | 324/750.25 |
| 6,718,848 B1 * | 4/2004 | Liversidge | | 81/9.42 |
| 7,163,201 B2 * | 1/2007 | Bernstein | | 269/32 |
| 7,384,420 B2 * | 6/2008 | Dycus et al. | | 606/51 |
| 7,434,440 B2 * | 10/2008 | Fay | | 72/409.1 |
| 7,655,007 B2 * | 2/2010 | Baily | | 606/51 |
| 7,766,910 B2 * | 8/2010 | Hixson et al. | | 606/51 |
| 2004/0130087 A1 * | 7/2004 | Hirsch et al. | | 270/52.18 |
| 2007/0167083 A1 | 7/2007 | Mineo | | |
| 2011/0184404 A1 * | 7/2011 | Walberg et al. | | 606/33 |

\* cited by examiner

TEST FIXTURE WITH HIGH-CURRENT ELECTRICAL CONNECTION

BACKGROUND OF THE INVENTION

1. Technical Field of the Invention

The invention relates to test fixtures and electrical connectors or circuit cards.

2. Description of the Related Art

Testing of high-volume circuit card assemblies (CCAs) typically involves applying power to a CCA via spring contact pins or other traditional connectors. For high-current applications, however, spring contact pins have limitations, such as low contact pressure, which results in small localized areas of intermetallic contact at the interface between a power connector and a CCA terminal interface. The high current delivered over the small contact area creates localized joule heating at the intermetallic spot contacts. This introduces a risk of a power connector welding itself to a CCA terminal interface during testing. In addition, spring pins apply a spring force, which may result in deformation of a circuit board or printed wire board. Such deformation or flexure may cause damage to components or circuits on the CCA.

From the foregoing it will be appreciated that improvements in high-current contacts would be desirable.

SUMMARY OF THE INVENTION

According to an aspect of the invention, a clamping mechanism simultaneously tightens or loosens a pair of free-floating conductive material jaws that clamp electrical contacts of a circuit board.

According to another aspect of the invention, a test fixture for making an electrical connection with electrical contacts of a circuit board, includes: a housing; a pair of jaws, made of electrically conductive material, located within the housing for receiving the electrical contacts, and a clamping mechanism for clamping the jaws against the electrical contacts. The jaws independently float (are able to freely change position) within the housing.

According to yet another aspect of the invention, a method of making an electrical connection, includes the steps of: inserting electrical contacts into contact-receiving openings of conductive material jaws, wherein the inserting includes placing legs of the contacts between flat inner surfaces of sections of the jaws; and tightening a clamping mechanism to clamp the contacts in the jaws, with the flat inner surfaces of the sections of the jaws pressing against flat surfaces of the legs of the electrical contacts.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, which are not necessarily to scale.

DETAILED DESCRIPTION

A test fixture for making an electrical connection with electrical contacts of a circuit board includes jaws made of conductive material. The jaws may be monolithic pieces of copper, with a pair of sections that pivot along a thin hinged portion at one end. The jaws float freely within a test fixture housing, allowing the jaws to reposition themselves within the housing to adjust to variations in position of the electrical contacts. A clamping mechanism is used to secure the jaws against the contacts of the circuit board. The clamping mechanism pushes free ends of the jaw sections toward one another, causing engagement between the sections and the electrical contacts. The test fixture provides a way to provide good contact area and good contact pressure, allowing large-current flows between the jaws and the electrical contacts, while at the same time providing substantially no force on the circuit board in a direction perpendicular to the circuit board.

Figure 1:
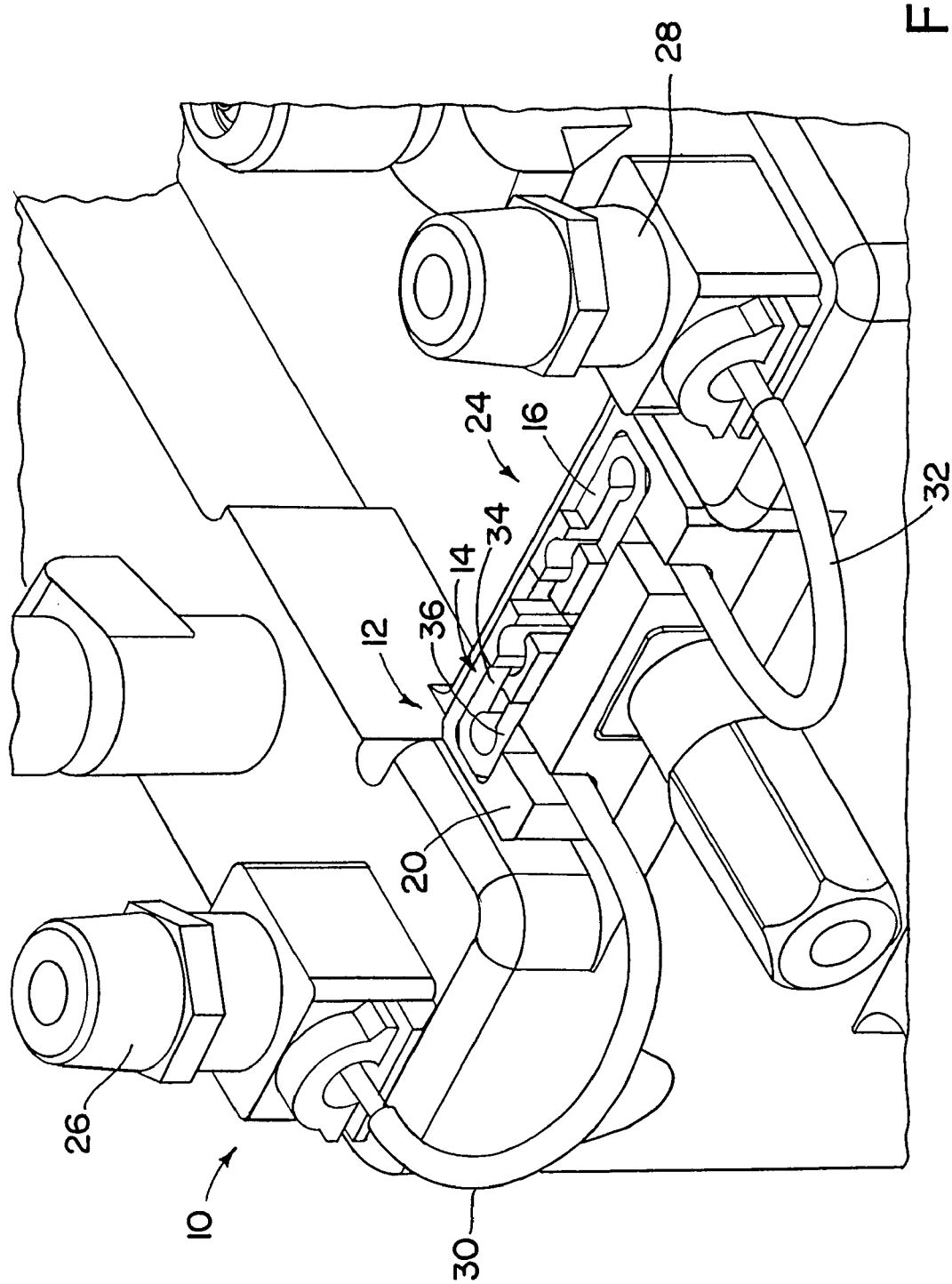
FIG. 1 is an orthogonal view of a portion of test fixture in accordance with an embodiment of the present invention.

Referring initially to FIG. 1, a test fixture 10 is used in testing a circuit board, such as a combined circuit assembly (CCA). The test fixture 10 includes an electrical connector 12 for making an electrical connection with electrical contacts of the circuit board (CCA). The electrical connector 12 includes a pair of jaws 14 and 16, made of electrically conductive material. The jaws 14 and 16 are located within a housing 20, and are free to float (change position) to some extent within the housing 20. The amount of float may be at least 0.76 mm (0.030 inches). The clamping mechanism 24 is used to clamp the jaws 14 and 16 against the electrical contacts of the circuit board (CCA).

Jacks or posts 26 and 28 are coupled to the jaws 14 and 16 by respective lead wires 30 and 32. The jacks 26 and 28, the lead wires 30 and 32, and the conductive material jaws 14 and 16, all are used to provide high-current electrical energy to a circuit board being tested. The amount of current provided through the test fixture 10 may be on the order of 55 amps, to give an example value.

Figure 2:
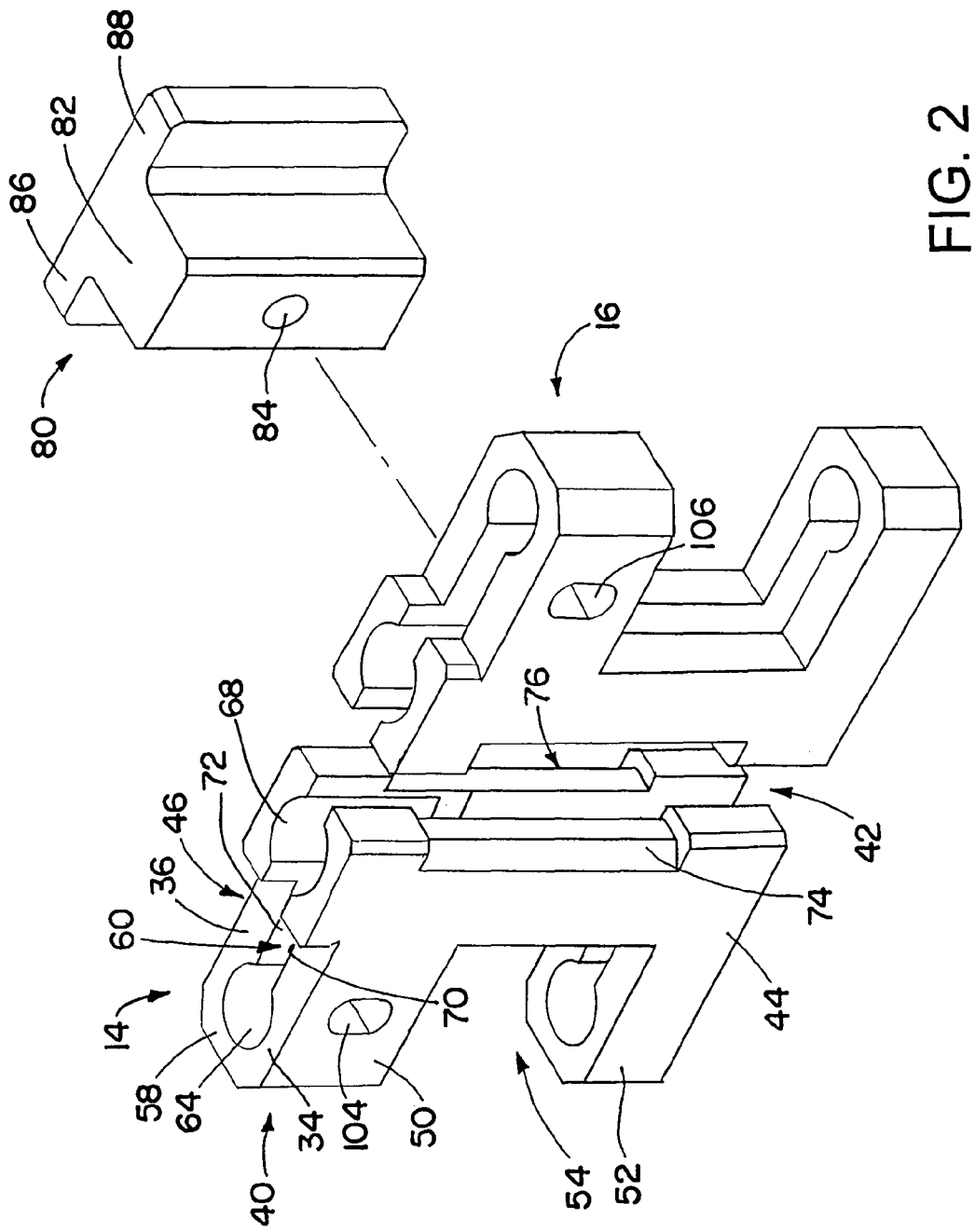
FIG. 2 is an exploded view of some parts of an electrical connection of the test fixture in FIG. 1.
Figure 3:
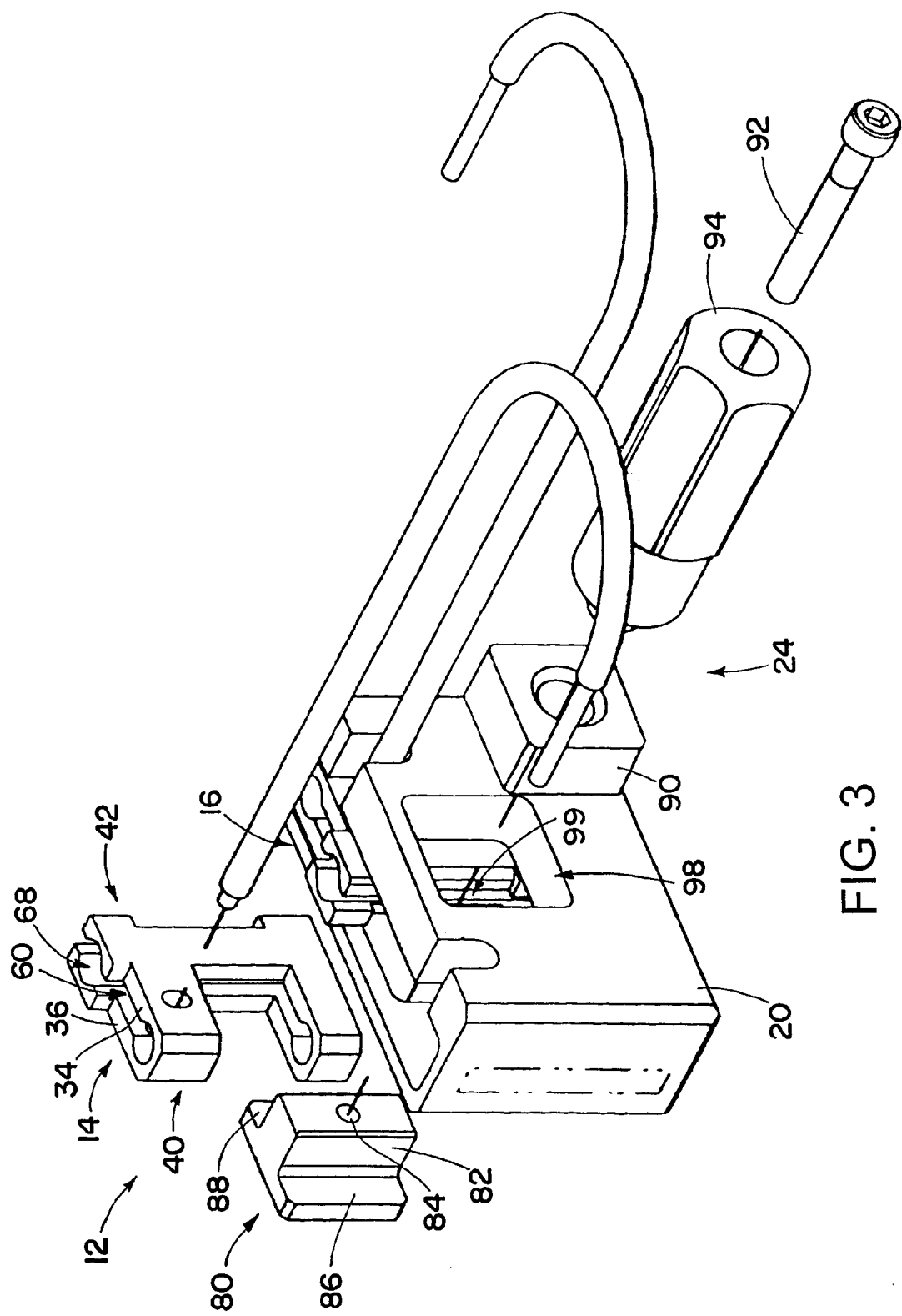
FIG. 3 is another exploded view of parts of the electrical connection of the test fixture of FIG. 1.

Referring now in addition to FIG. 2, details are given of the configuration of the jaws 14 and 16. The discussion below is focused on the configuration of the jaw 14. However, it will be appreciated that the jaw 16 may have similar features to the jaw 14. The jaws 14 and 16 may be mirror images of one another, having substantially the same features.

The jaw 14 has a pair of planar sections 34 and 36. The sections 34 and 36 are joined together at a hinge end 40. At an opposite open end 42, the sections 34 and 36 run substantially parallel to one another, but do not contact each other. The sections 34 and 36 have a capital C-shape, with a C-shape cross section parallel to outside major surfaces 44 and 46 of the sections 34 and 36. The shape of the sections 34 and 36 define an upper arm 50 and a lower arm 52 of the jaw 14, separated by a cut out section 54.

Except for a thinned portion 58 of material at the hinge end 40 of the upper and lower arms 50 and 52, the sections 34 and 36 are separated from one another by a slot 60. The slot 60 has a substantially uniform width throughout its center portion. Closer to the hinge end 40, the slot 60 widens out to a hinge hole 64. The hinged hole 64 serves to thin the material of the jaw 14 in the vicinity of the hinge end 40. This facilitates bending of the sections 34 and 36 relative to one another when sufficient force is placed on the outside major surfaces 44 and 46 of the sections. The hinge hole 64 may be configured in size and shape to allow desired bending characteristics for the sections 34 and 36 of the jaw 14.

Near the open end 42, the slot 60 opens into a contact-receiving opening 68. The contact-receiving opening 68 receives electrically contacts of the circuit card or CCA. The jaw 14 may be clamped onto an electrical contact by applying pressure to the outside major surfaces 44 and 46. This produces bending at the hinge end 44 of the jaw 14, pressing the sections 34 and 36 toward one another along the open end 42. This reduces the thickness of the slot 60, which may cause parts of the contacts to be clamped between inner surfaces 70 and 72 of the sections 34 and 36, at the level of the upper arm 50.

The jaws 14 and 16 may each be continuous, monolithic, single unbroken pieces of electrically-conductive material. Copper is an example of a suitable electrically-conductive material for the jaws 14 and 16. The jaws may be formed by a suitable process, such as machining or casting.

The major surfaces 44 and 46 have indentations 74 and 76 in them to facilitate receiving parts of a T-nut 80. The T-nut 80 includes a central body 82 having an internally threaded hole 84 in its center. A pair of ears 86 and 88 extend in opposite directions from one end of the central body 82. The T-nut 80 is part of the clamping mechanism 24 (FIG. 1) that is used to compress the jaws 14 and 16 into engagement with the electrical contacts of the circuit card or CCA. The central body 82 of the T-nut 80 fits between the jaws 14 and 16, with corners between the central body 82 and the ears 86 and 88 fitting into the indentations 74 and 76 in the jaw sections 34 and 36. The ears 86 and 88 each bear against one of the major surfaces of one of the jaws 14 and 16.

The indentations 74 and 76 may be configured so as to capture the central body 82 of the T-nut 80. It may be necessary to remove the T-nut 80 from the housing 20 in order to insert or remove the jaws 14 and 16 into or out of the housing 20. Once the electrical connection 12 has been assembled it stays together as a unit. Even with the clamping mechanism 24 loosened to some degree, the T-nut central body 82 serves to prevent the jaws 14 and 16 from being removed from the housing 20.

The T-shape nut 80 may be made of a suitable dielectric material. It would be appreciated that a wide variety of molded plastic materials or other plastics may be used in forming the T-shape nut 80.

Figure 4:
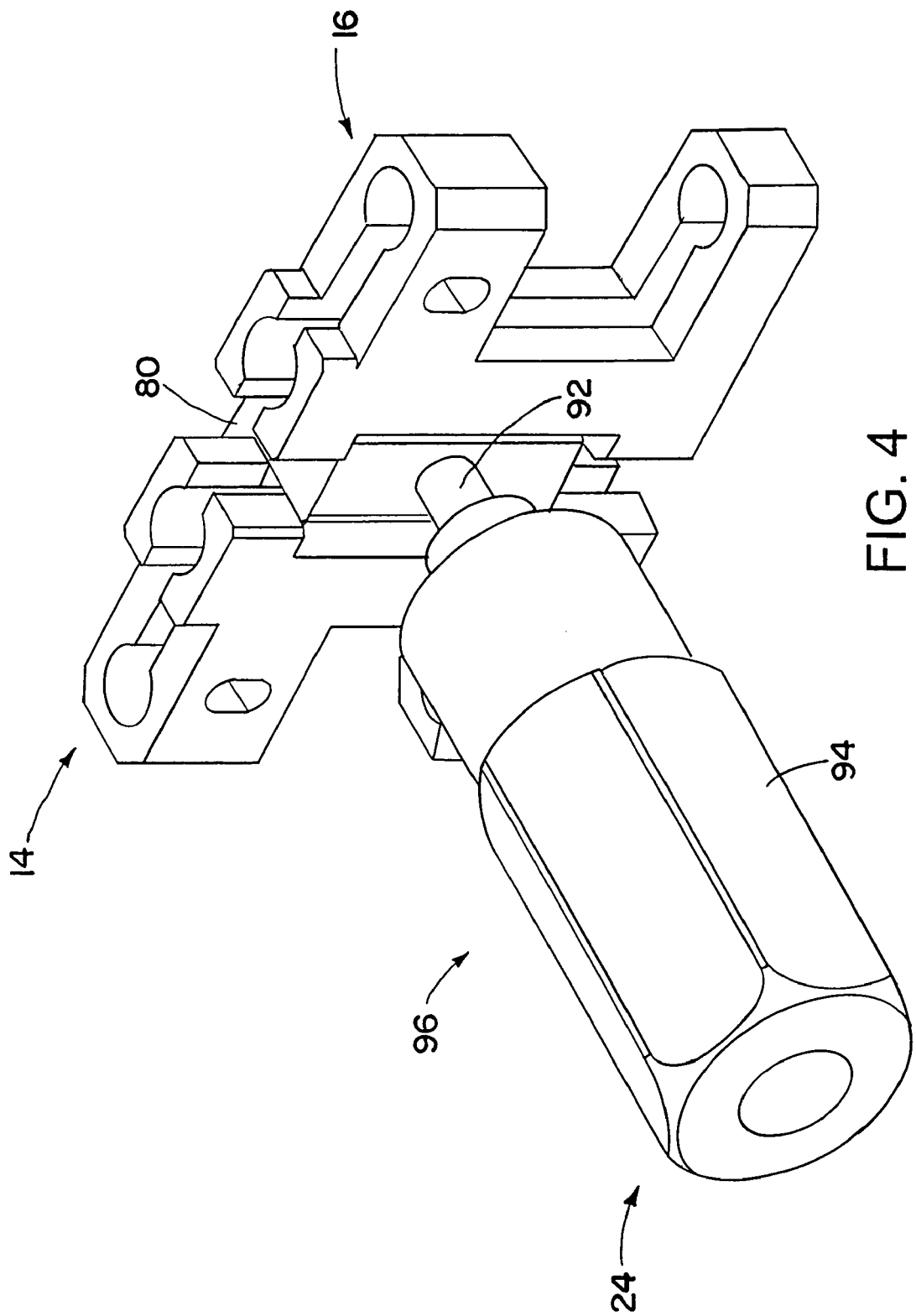
FIG. 4 is an oblique view showing some of the parts of the electrical connection of the test fixture of FIG. 1.
Figure 5:
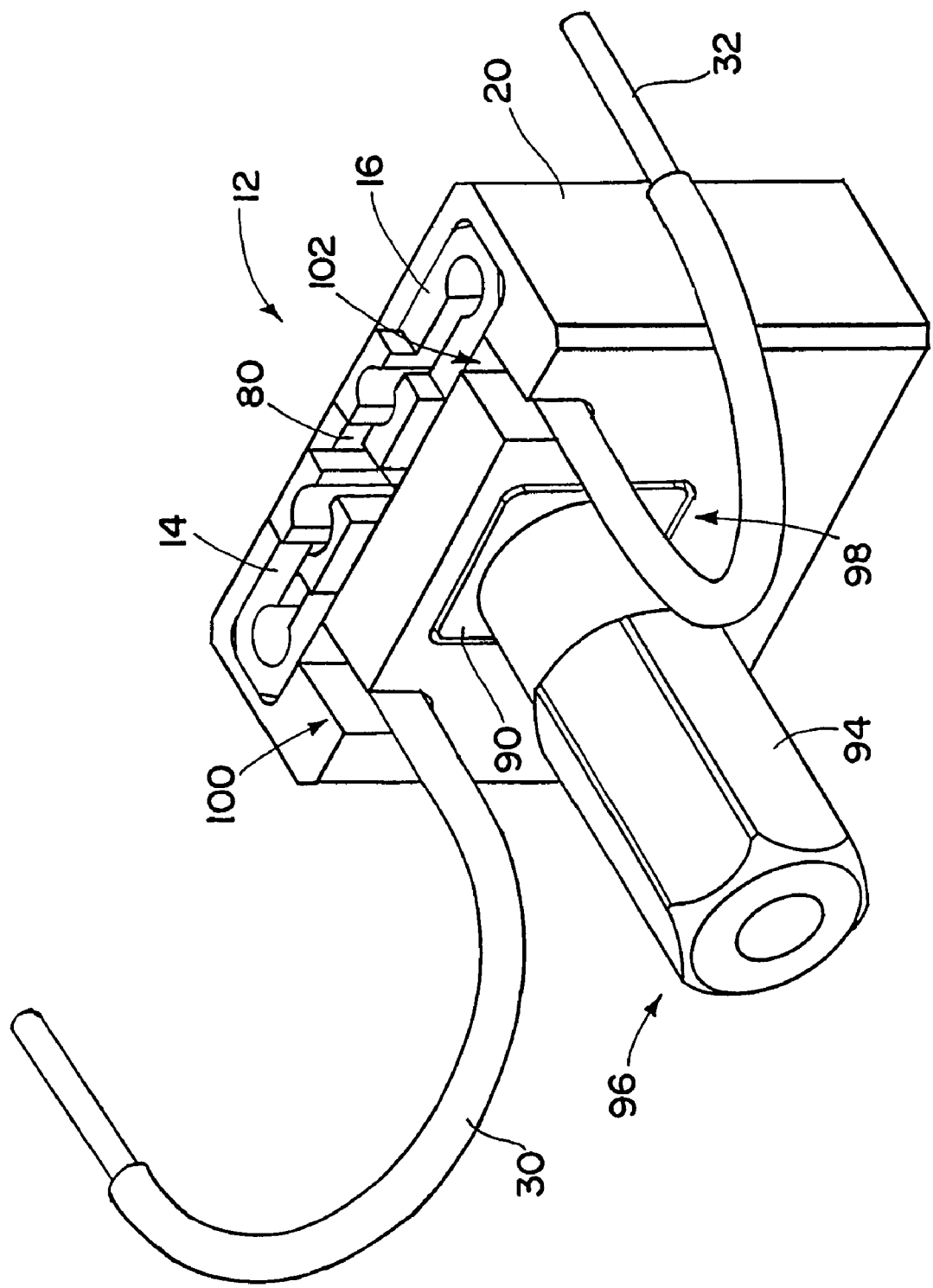
FIG. 5 is an oblique view of still other parts of the electrical connection of the test fixture of FIG. 1.

Referring now in addition to FIGS. 4 and 5, further portions of the clamping mechanism 24 are a washer 90, and a screw 92 having a handle or knob 94 attached to it. The screw 92 and the handle or knob 94 together constitute a threaded member 96. The washer 90 has a square shape, and is made of a dielectric material. The washer 90 bears against surfaces of the jaws 14 and 16 on an opposite side from that of the T-nut ears 86 and 88. The washer 90 may be made of suitable dielectric material, such as a suitable plastic.

The screw 92 threadely engages the internally-threaded hole 84 in the T-nut 80. The knob or handle 94 may be turned to tighten the clamping mechanism 24, pushing the washer 90 toward the T-nut 80. With the washer 90 bearing against front surfaces of the jaws 14 and 16, and the T-nut ears 86 and 88 bearing against back major surfaces of the jaws 14 and 16, tighten of the clamping mechanism compresses the jaws 14 and 16. This causes the jaws 14 and 16 to pivot about the hinge ends 40. Bringing the sections 34 toward the sections 36, thus constricting the slot 60 between the sections 34 and 36. Turning the knob or handle 94 in an opposite direction loosens the clamping mechanism 24. This allows the slot 60 to open up allowing the electrical contacts of the circuit board to be removed from the opening 68.

The washer 90 and the T-nut 80 may be located in respective openings 98 and 99 in the front and back walls of the housing 20. The holes 98 and 99 for receiving the T-nut 80 and the washer 90 may be aligned with one another. The holes 98 and 99 may be substantially square holes having a size larger than the T-nut 80 and the washer 90. This allows the T-nut 80 and the washer 90 to float to some extent within the holes 98 and 99, enabling movement of the jaws 14 and 16 relative to the housing. However, the holes are sized so as to prevent rotation of the T-nut 80 and the washer 90.

The housing 20 has a pair of open slots or notches 100 and 102 for receiving the lead wires 30 and 32. The lead wires 30 and 32 may be placed in and removed from the open notches or slots 100 and 102 without de-coupling the lead wires 30 and 32 from the jaws 14 and 16. The jaws 14 and 16 have elongate holes 104 and 106 (FIG. 2) for receiving ends of the lead wires 30 and 32. The lead wire ends may be placed in the holes 104 and 106 and soldered to the jaws 14 and 16. This soldering is best performed with the jaws 14 and 16 removed from the housing 20. After the soldering is accomplished, the jaws 14 and 16 and the attached lead wires 30 and 32 may be placed into the housing 20. Then the T-nut 80 may be loaded in the back housing hole 99, with the central nut body 82 between the jaws 14 and 16. Use of the open notches or slots 100 and 102 allows individual placement of each combination of one of the jaws 14 and 16 and one of the lead wires 30 and 32.

Figure 6:
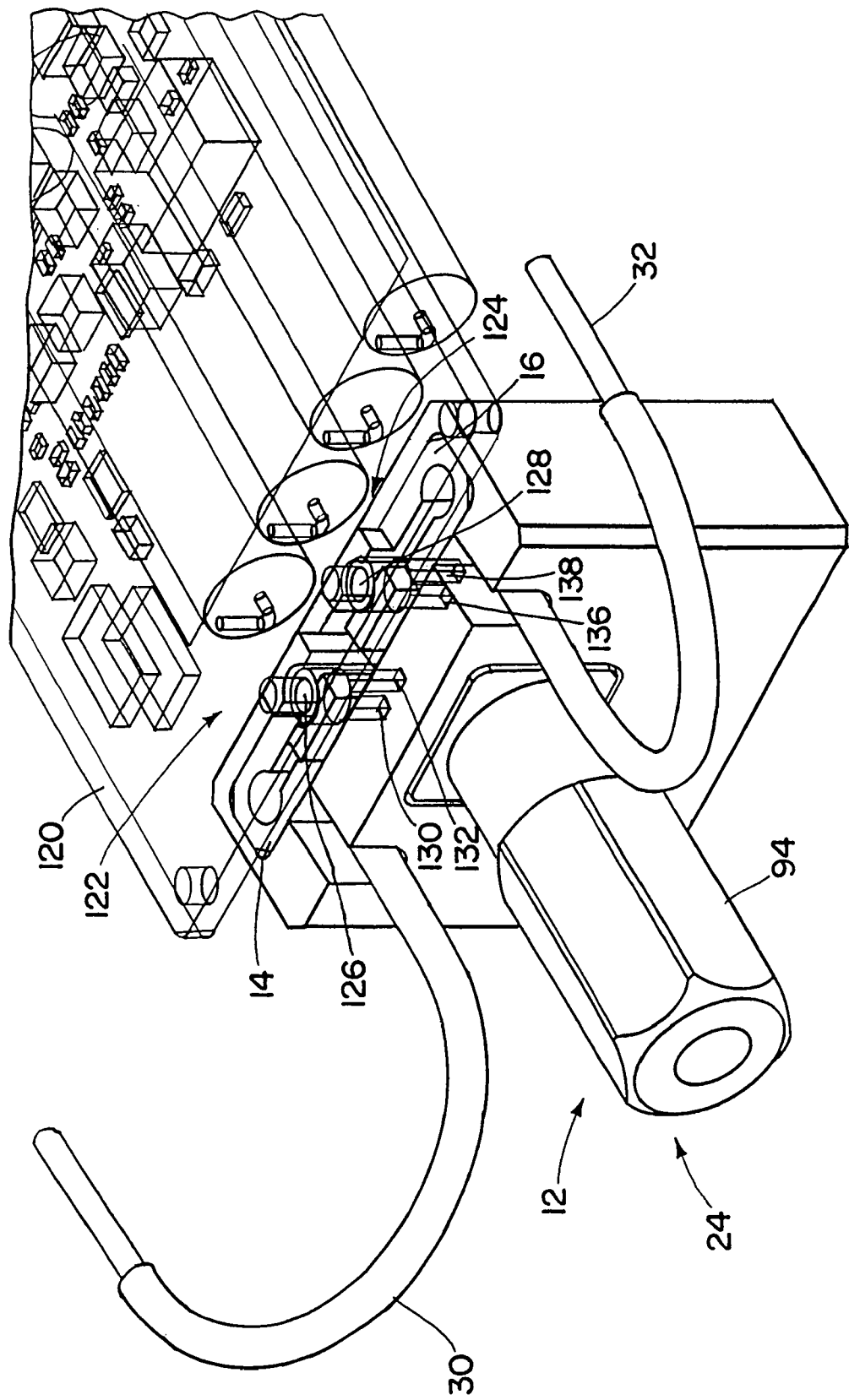
FIG. 6 is an oblique view showing connection between a circuit board or circuit card assembly (CCA), and the electrical connection of the test fixture of FIG. 1.
Figure 7:
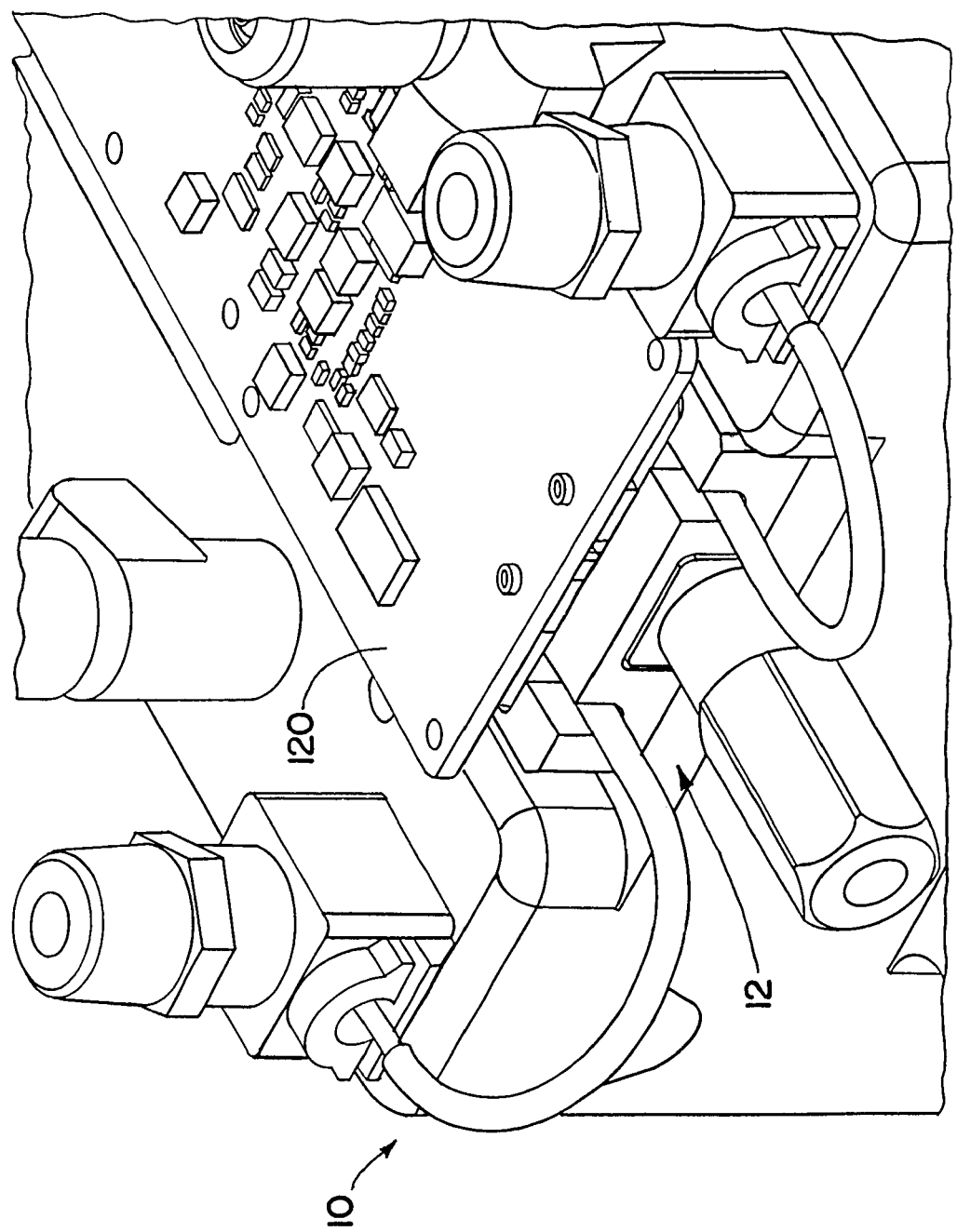
FIG. 7 is an oblique view showing the test fixture of FIG. 1, with a circuit board or circuit card assembly coupled to the test fixture.

FIGS. 6 and 7 show a circuit card 120 coupled to the test fixture 10. The circuit card 120 includes a pair of electrical contacts 122 and 124 that are substantially perpendicular to the plane of the circuit card 120. The contacts 122 and 124 have a Y-shape, or a shape similar to that of a tuning fork. Central downward members 126 and 128 each branch out to a pair of downward-directed legs 130 and 132, and 136 and 138. The legs 130-138 may all have a substantially rectangular cross section, such as a square cross section. The openings 68 of the jaws 14 and 16 provide a diametrical clearance around the contacts 122 and 124 for easy insertion and removal of the circuit card or circuit card assembly 120. When the contacts 122 and 124 are inserted into the jaws 14 and 16 the clamping mechanism 24 may be tightened to clamp the legs 130 and 132 between the sections of the jaw 14, and the legs 136 and 138 between the sections 34 and 36 of the jaw 16. By pressing flat internal surfaces 70 and 72 of the jaw sections 34 and 36 against flat surfaces of the legs 130-138, good contact area and good contact force is provided between the jaws 14 and 16 in the contacts 122 and 124. The configuration of the hinge end 40 of the jaws 14 and 16 enables the jaw sections 34 and 36 to make good contact with both of the legs 136 and 138 of the electrical contact 124. The clamping of the jaws 14 and 16 on the legs of the contacts 122 and 124 provides clamping with essentially zero force perpendicular to the circuit card or CCA 120. Thus there is substantially no force tending to deform the circuit card 120.

The electrical connection 12 provides good contact area and good force, allowing a large current to be transferred from the electrical connection 12 to the circuit card 120. A current on the order of 55 amps, to give one example, may be transferred without undue heating or current welding.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A test fixture for making an electrical connection with electrical contacts of a circuit board, the test fixture comprising
    a housing;
    a pair of jaws, made of electrically conductive material, located within the housing for receiving the electrical contacts; and
    a clamping mechanism for clamping the jaws against the electrical contacts;
    wherein the jaws independently float (are able to freely change position) within the housing;
    wherein the jaws each have a substantially circular opening for receiving respective of the electrical contacts.

2. The test fixture of claim 1, wherein the jaws are each monolithic single pieces of the electrically conductive material.

3. The test fixture of claim 1, wherein the jaws are each made of copper.

4. The test fixture of claim 1, wherein the clamping mechanism includes:
    a pair of dielectric members that bear against opposite major surfaces of each of the jaws; and
    a threaded member used for selectively bringing the dielectric members toward and away from one another, to selectively tighten or loosen both of the jaws simultaneously.

5. The test fixture of claim 4, wherein the threaded member includes a handle that is turned to tighten or loosen the jaws.

6. A test fixture for making an electrical connection with electrical contacts of a circuit board, the test fixture comprising
    a housing;
    a pair of jaws, made of electrically conductive material, located within the housing for receiving the electrical contacts; and
    a clamping mechanism for clamping the jaws against the electrical contacts;
    wherein the jaws independently float (are able to freely change position) within the housing;
    wherein the jaws have respective holes therein; and
    further comprising lead wires soldered to the respective holes.

7. The test fixture of claim 6, wherein the lead wires pass through open slots in the housing, allowing the wires and jaws to be removed from the housing without separating the wires from the jaws.

8. The test fixture of claim 6,
    wherein each of the jaws includes a pair of planar sections that are connected at a first hinged end, and are not connected at a second open end; and
    wherein a slot between the sections is selectively changed in thickness by movements of the clamping mechanism.

9. The test fixture of claim 8,
    wherein the sections define a substantially circular contact-receiving opening closer to the open end than the hinge end; and
    wherein the circular opening receives one of the electrical contacts, and is selectively constricted or opened by corresponding movements of the clamping mechanism.

10. A test fixture for making an electrical connection with electrical contacts of a circuit board, the test fixture comprising
    a housing;
    a pair of jaws, made of electrically conductive material, located within the housing for receiving the electrical contacts; and
    a clamping mechanism for clamping the laws against the electrical contacts;
    wherein the jaws independently float (are able to freely change position) within the housing;
    wherein the clamping mechanism includes:
        a pair of dielectric members that bear against opposite major surfaces of each of the laws; and
        a threaded member used for selectively bringing the dielectric members toward and away from one another, to selectively tighten or loosen both of the jaws simultaneously; and
    wherein the dielectric members includes a T-shape nut that includes:
        a central portion having a threaded hole that is threadedly engaged by the threaded member; and
        a pair of ears extending from opposite sides of the central portion; and
    wherein surfaces of the ears press against respective of the jaws to tighten the jaws.

11. The test fixture of claim 10, wherein the nut is in a hole in the housing, with the nut free to translate within the hole, but not rotate within the hole.

12. The test text fixture of claim 10, wherein the nut includes a central body that is between the jaws and that engages the jaws to retain the jaws in the housing.

13. A test fixture for making an electrical connection with electrical contacts of a circuit board, the test fixture comprising
    a housing;
    a pair of jaws, made of electrically conductive material, located within the housing for receiving the electrical contacts; and
    a clamping mechanism for clamping the jaws against the electrical contacts;
    wherein the jaws independently float (are able to freely change position) within the housing;
    wherein each of the laws includes a pair of planar sections that are connected at a first hinged end, and are not connected at a second open end;
    wherein a slot between the sections is selectively changed in thickness by movements of the clamping mechanism; and wherein for each of the jaws the sections have a C-shape cross-sections parallel to a major surface of the jaw, with a cut-out portion between an upper arm and a lower arm of the sections.

14. A test fixture for making an electrical connection with electrical contacts of a circuit board, the test fixture comprising a housing;

a pair of jaws, made of electrically conductive material, located within the housing for receiving the electrical contacts; and a clamping mechanism for clamping the jaws against the electrical contacts;

wherein the jaws independently float (are able to freely change position) within the housing;

wherein each of the jaws includes a pair of planar sections that are connected at a first hinged end, and are not connected at a second open end;

wherein a slot between the sections is selectively changed in thickness by movements of the clamping mechanism; and wherein the sections have a thinned portion, thinner than other portions of the sections, at the hinge end.

15. The test fixture of claim 14, wherein the thinned portion is part of a boundary of a substantially-circular hinge hole at the hinge end.

16. A test fixture for making an electrical connection with electrical contacts of a circuit board, the test fixture comprising a housing;

a pair of jaws, made of electrically conductive material, located within the housing for receiving the electrical contacts; and a clamping mechanism for clamping the jaws against the electrical contacts;

wherein the jaws independently float (are able to freely change position) within the housing;

in combination with the circuit board, wherein the text fixture places substantially no force on the circuit board in a direction perpendicular to the circuit board when the jaws are clamped against the electrical contacts.

17. The combination of claim 16, wherein the electrical contacts each include a pair of downward-directed legs that are substantially perpendicular to the circuit board; and wherein the jaws engage the legs when the jaws are clamped onto to the contacts.

18. The combination of claim 17, wherein the jaws includes a pair of planar sections that are connected at a first hinged end, and are not connected at a second open end;

wherein a slot between the sections is selectively changed in thickness by movements of the clamping mechanism; and wherein inner flat surfaces of the sections that border the slot engage flat surfaces of the legs when the jaws are clamped on the electrical contacts.

19. The combination of claim 16, wherein the jaws reposition themselves within the housing to adjust to variations in position of the electrical contacts.

20. The combination of claim 16, wherein the jaws are each monolithic single pieces of the electrically conductive material.

21. The combination of claim 16, wherein the jaws are each made of copper.

22. The combination of claim 16, wherein the clamping mechanism includes:

a pair of dielectric members that bear against opposite major surfaces of each of the jaws; and a threaded member used for selectively bringing the dielectric members toward and away from one another, to selectively tighten or loosen both of the jaws simultaneously.

* * * * *